United States Patent [19]
Staver et al.

[11] Patent Number: 5,677,845
[45] Date of Patent: Oct. 14, 1997

[54] PROGRAMMABLE DATA ACQUISITION SYSTEM FOR COLLECTING ELECTRICAL POWER SIGNALS

[75] Inventors: Daniel Arthur Staver, Scotia, N.Y.; Chung-Yih Ho, Chavenay, France; Donald Thomas McGrath, Scotia, N.Y.

[73] Assignee: General Electric Company, Schenectady, N.Y.

[21] Appl. No.: 459,861

[22] Filed: Jun. 2, 1995

[51] Int. Cl.$^6$ .................................. G06F 7/38; G06F 7/70
[52] U.S. Cl. ........................ 364/483; 346/481; 395/800; 324/73.1
[58] Field of Search ........................ 364/480, 481, 364/483, 187, 724.01; 371/15.1; 324/73.1, 158.1, 142, 143; 395/800, 775

[56] References Cited

U.S. PATENT DOCUMENTS

| | | | |
|---|---|---|---|
| 4,546,343 | 10/1985 | Higgins et al. | 340/347 |
| 4,635,259 | 1/1987 | Schinabeck et al. | 371/20 |
| 4,724,379 | 2/1988 | Hoffman | 324/73 |
| 4,752,869 | 6/1988 | Miller et al. | 364/187 |
| 4,763,107 | 8/1988 | Koen et al. | 340/347 |
| 4,931,723 | 6/1990 | Jeffrey et al. | 324/73.1 |
| 5,349,676 | 9/1994 | Garverick et al. | 395/800 |
| 5,448,747 | 9/1995 | Garverick et al. | 395/800 |
| 5,463,569 | 10/1995 | Staver et al. | 364/724.1 |
| 5,485,393 | 1/1996 | Bradford | 364/483 |

*Primary Examiner*—James P. Trammell
*Assistant Examiner*—Bryan Bui
*Attorney, Agent, or Firm*—Donald S. Ingraham

[57] ABSTRACT

A programmable data acquisition system including a plurality of input signal channels for receiving a respective input signal during a normal mode of operation is provided. Individual test circuits are used for selecting respective ones of the plurality of channels to receive predetermined reference signals during a test mode of operation while uninterruptedly providing the normal mode of operation in any remaining unselected channels in the data acquisition system. An analog-to-digital (A/D) converter system, such as delta-sigma modulators and decimation filters having a selectable decimation ratio, allows for supplying quantized electrical signals at a predetermined rate. The A/D converter is responsive to any signals carried in the plurality of signal channels as selected by the individual test circuits. A control unit allows for supplying respective control signals to the test circuits and to the converter system. The data acquisition system can further include at least one feedback generating circuit for generating a measurement signal supplied to a respective one of the signal channels. This allows the data acquisition system for interfacing with a zero-flux current sensor.

14 Claims, 4 Drawing Sheets

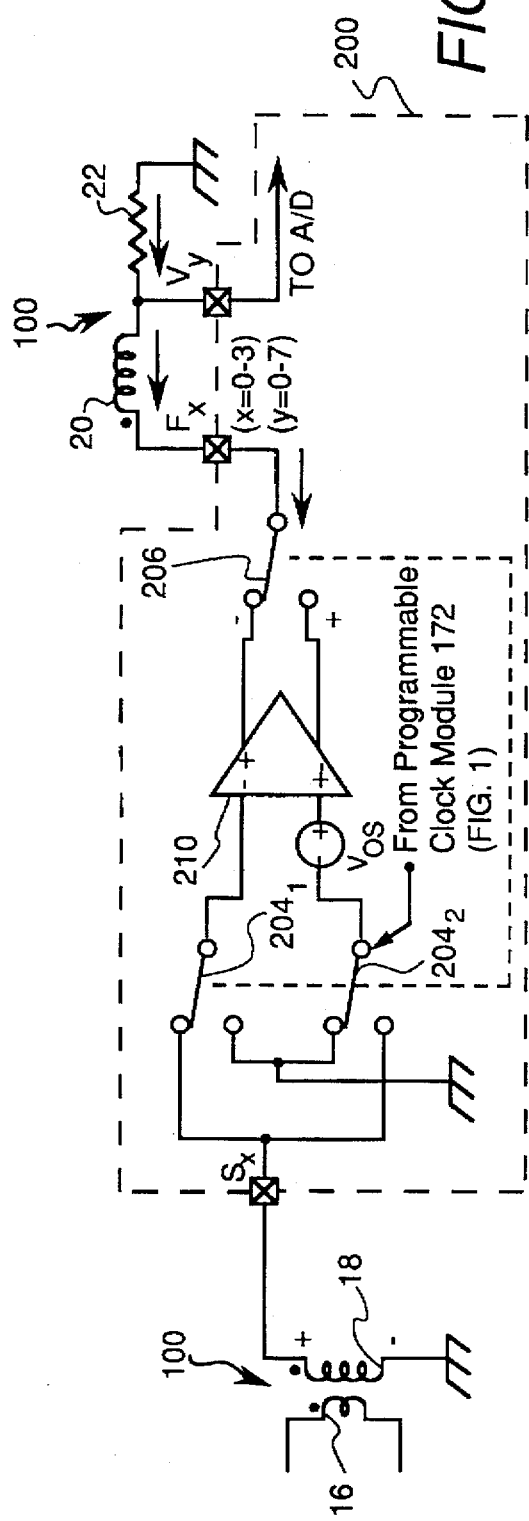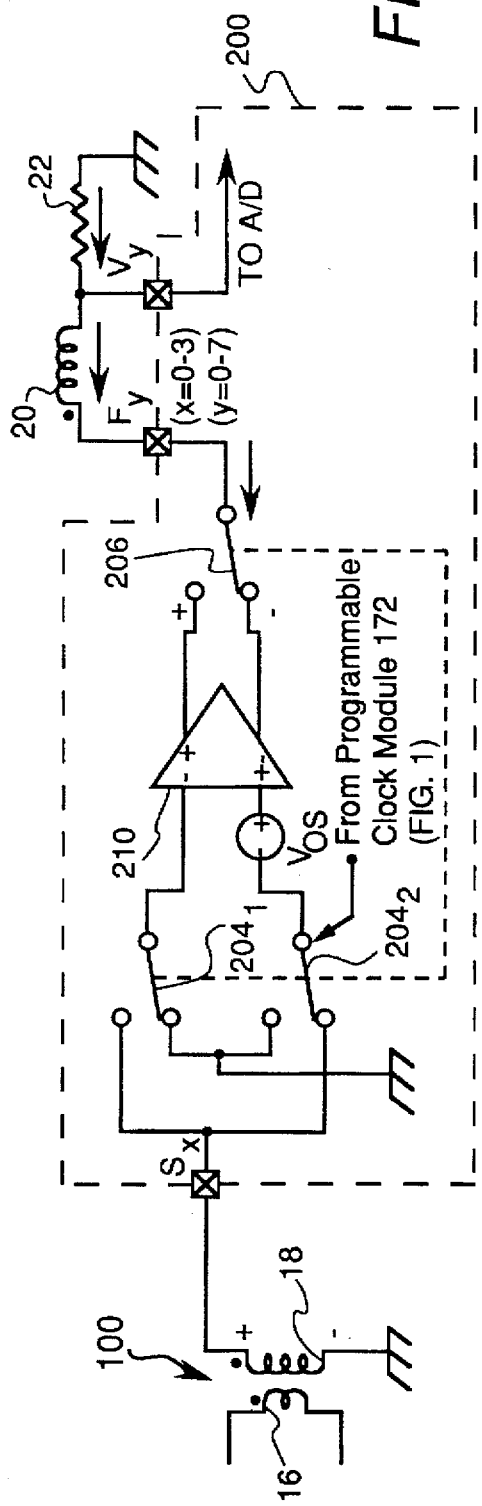
FIG. 2A
FIG. 2B

PROGRAMMABLE DATA ACQUISITION SYSTEM FOR COLLECTING ELECTRICAL POWER SIGNALS

RELATED APPLICATIONS

This application is related to patent application Ser. No. (08/459,852), entitled "A Programmable Data Acquisition System With a Microprocessor For Correcting Magnitude and Phase of Quantized Signals While Providing a Substantially Linear Phase Response", filed concurrently with the present invention, assigned to the same assignee of the present invention and herein incorporated by reference.

BACKGROUND OF THE INVENTION

The present invention relates to monolithic electronic integrated circuits, and, more particularly, to a monolithic electronic integrated circuit for a programmable data acquisition system employed for collecting electrical power signals.

Several conflicting objectives are present in the field of high performance data acquisition for electrical power measurement, metering, and management. A first objective is high data resolution. The availability of high resolution analog-to-digital conversion methods, such as with sigma-delta modulators, combined with the power of state of the art digital signal processors provides the capability to achieve significant levels of accuracy. Thus, any suitable signal processing may be performed on precise data using conventional signal processing architectures. However, a second objective is increased signal processing bandwidth. An inherent tension exists between these two objectives in that increasing bandwidth typically occurs at the expense of data resolution. Yet, a third objective is compactly integrated or electronic circuitry that requires less power to operate. A need thus exists for a data acquisition system having the capability to balance high data resolution demands against large bandwidth demands, as desired for power measurement, metering, and management systems, while having the size and power requirements of a conventional electronic or integrated circuit component.

It is also desirable to provide a data acquisition system capable of performing preventative diagnostics in the field without having to wait until a "hard failure" occurs and all operational capability is lost. Thus a need exists for providing a data acquisition system which provides substantial operational capability even while undergoing testing. It is further desirable to provide a data acquisition system that includes a feedback circuit for interfacing with sensors, such as zero-flux current sensors, that may require a feedback signal to avoid core saturation in the presence of large current loads.

SUMMARY OF THE INVENTION

Generally speaking, the present invention fulfills the foregoing needs by providing a programmable data acquisition system including a plurality of input signal channels for receiving a respective input signal during a normal mode of operation. Circuit means, such as individual test circuits, are used for selecting respective ones of the plurality of channels to receive predetermined reference signals during a test mode of operation while uninterruptedly providing the normal mode of operation in any remaining unselected channels in the data acquisition system. An analog-to-digital (A/D) converter system, such as made up of delta-sigma modulators, and decimation filters having a selectable decimation ratio, allows for supplying quantized electrical signals at a predetermined rate. The A/D converter system is responsive to any signals carried in the plurality of signal channels as selected by the circuit means. A control unit allows for supplying respective control signals to the circuit means and to the converter means. The data acquisition system can further include at least one feedback generating circuit for generating a measurement signal supplied to a respective one of the signal channels. This allows the data acquisition system for interfacing with, for example, a zero-flux current sensor.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like numbers represent like pans throughout the drawings, and in which:

FIGS. 2A and 2B show additional details for any given one of the feedback generating circuits shown in FIG. 1, including a switching assembly therein that can be actuated at a selectable switching rate;

DETAILED DESCRIPTION OF THE INVENTION

Figure 1:
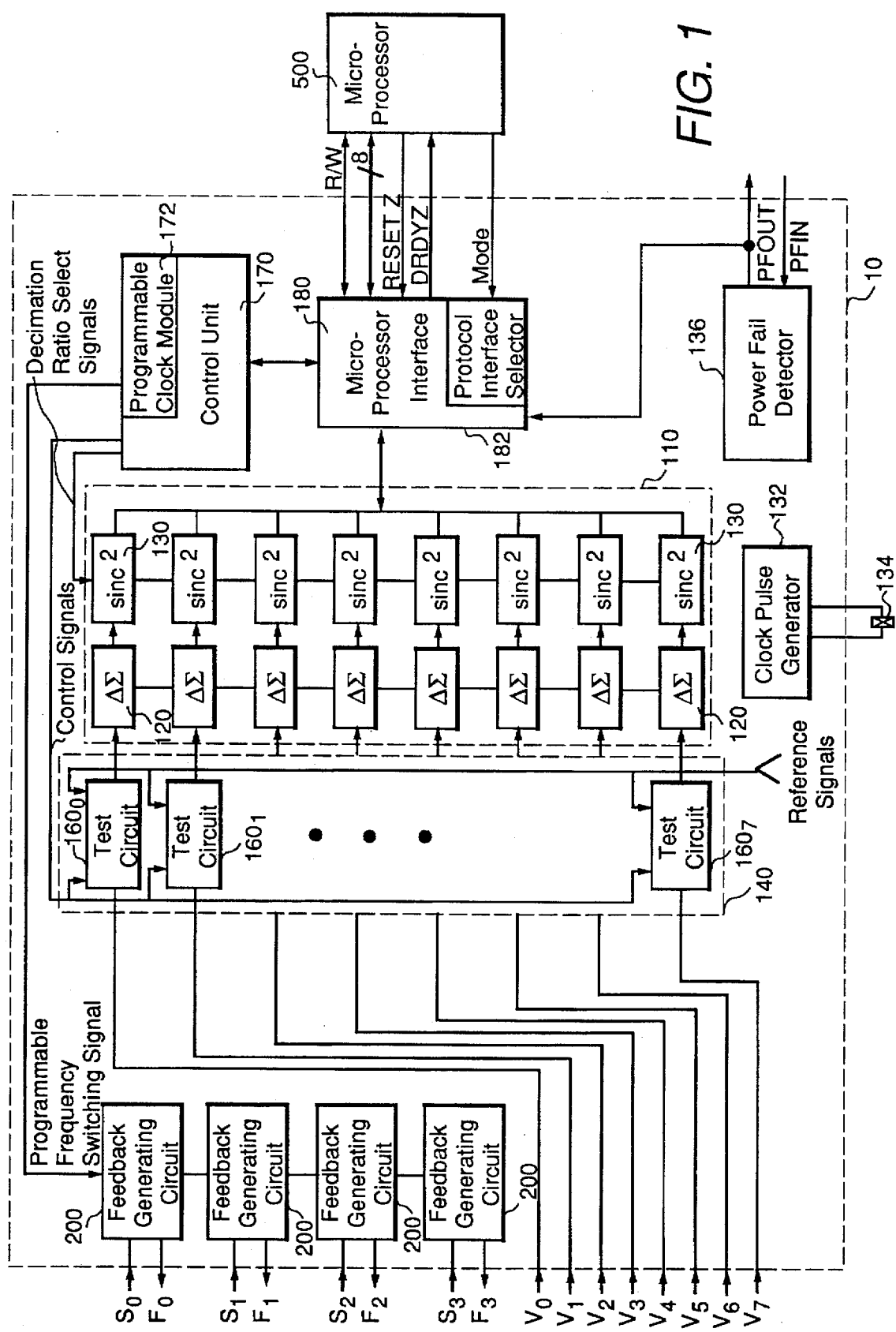
FIG. 1 shows a schematic block diagram for a data acquisition system in accordance with the present invention including feedback generating circuits for interfacing with sensors, such as zero-flux current sensors, and individual test circuits for performing diagnostics in the data acquisition system.

FIG. 1 is a schematic of one embodiment for a programmable data acquisition system (DAS) 10 for collecting electrical power signals in accordance with the present invention. The embodiment comprises a monolithic electronic integrated circuit (IC) chip having input signal channels $V_0$–$V_7$ which during a normal mode of operation can couple or interface to eight external sensors (not shown) producing electrical signals providing power measurements, such as substantially instantaneous current or voltage signals, to the DAS. The input signals generally constitute substantially continuous, substantially alternating electrical signals substantially having a primary or fundamental frequency. Thus, although DAS 10 generally operates in conjunction with analog electrical signals that are continuous, alternating, and have a fundamental or primary frequency, typically 60 Hertz frequency; it will be appreciated that the DAS operation is not limited to analog alternating signals being that digital and/or direct current (DC) signals can be readily collected by the DAS. The DAS converts these input signals to variable-length digital signals by means of an analog-to-digital converter system 110 comprising a plurality of delta-sigma modulators 120, and a corresponding plurality of decimation filters 130. In this particular embodiment, converter system 110 is arranged in a configuration permitting use of decimation filters having a selectable decimation ratio, as described in U.S. Pat. No. 5,548, 540, entitled "Decimation Filter Having a Selectable Decimation Ratio", assigned to the same assignee of the present invention and herein incorporated by reference; however, the invention is not limited in scope to this configuration. For example, the decimation filters could be as described in U.S. Pat. No. 5,463,569, entitled "Decimation Filter Using a Zero-Fill Circuit for Providing a Selectable Decimation Ratio", assigned to the same assignee of the present invention and herein incorporated by reference. Briefly, each decimation filter 130 is designed with the capability to balance high data resolution demands against large bandwidth demands, as desired for power measurement, metering, and management systems.

As shown in FIG. 1, a clock pulse generator 132 can be located within the DAS to receive oscillations from a crystal 134 for generating a system clock signal $F_{sys}$. Alternatively, the system clock signal could be readily obtained from an external clock source. By way of example, in this embodiment, each delta-sigma modulator 120 is clocked at one fourth of the system clock frequency. DAS 10 further includes a power-fail detector 136 which allows for comparing the level of an input signal labeled PFIN against a predetermined threshold value. Power-fail detector 136 supplies an output signal labeled PFOUT capable of having either of two states based upon the result of the comparison of the PFIN signal against the threshold value. One of the two states for the output signal is conveniently chosen to correspond to detection of the power-fail condition in the DAS. For example, whenever the level of the PFIN signal drops below the predetermined threshold value, output signal PFOUT can have a logic value of ZERO which can be indicative of detection of the power fail condition.

As illustrated in FIG. 1, the DAS also includes test circuit means 140, such as made up by a plurality of individual test circuits $160_0$–$160_7$, for selecting respective ones of signal channels $V_0$–$V_7$ to receive predetermined reference signals during a test mode of operation, such as described in U.S. Pat. No. 5,589,766, entitled "Field-Testable Integrated Circuit" filed on Apr. 6, 1995, assigned to the same assignee of the present invention and herein incorporated by reference. In accordance with one advantage of the present invention, this can be accomplished while uninterruptedly providing the normal mode of operation in any remaining unselected channel in DAS 10. For example, if signal channel $V_0$ is selected to receive any reference signal during the test mode of operation, the remaining unselected channels $V_1$–$V_7$ would still continue to operate in the normal mode of operation. This is a desirable feature since a DAS in accordance with the present invention can provide substantial functionality even at times during which any selected one of the signal channels is undergoing testing. DAS further provides a control unit 170 which can be used to provide respective control signals to the individual test circuits $160_1$–$160_7$, to the decimation filters 130 and, as will be explained shortly hereafter, to other circuitry, such as one or more feedback generating circuits 200, contained in the DAS. For example, depending on the state of the respective control signals supplied to each decimation filter 130, the control unit would allow for selecting a respective decimation ratio for each decimation filter 130. For example, as described in U.S. Pat. No. 5,548,540, each decimation filter could have an upper decimation ratio bound chosen so that $2^N=4096$ (i.e., N=12); and having a lower decimation ratio chosen so that $2^{N-(S-1)}=32$ (i.e., S=8). In general, letter S represents a predetermined integer less than N corresponding to the number of selectable decimation ratios provided by the decimation filter and chosen so that $2^{N-(S-1)}$ constitutes a lower decimation ratio bound of the decimation filter while letter N represents a predetermined integer chosen so that $2^N$ constitutes an upper decimation ratio bound of the decimation filter. It should be appreciated that these respective bounds for the decimation filter are chosen only by way of example and not of limitation. Similarly, depending on the state of the respective control signals supplied to the individual test circuits $160_0$–$160_7$, the control unit would allow for selecting whether any one of signal channels $V_0$–$V_7$ will be selected to be in a respective test mode or a normal mode of operation.

As suggested above, DAS 10 further includes one or more feedback generating circuits 200 which can be respectively connected to a sensor, such as a zero flux current sensor, via a respective one of connecting port pairs $S_0$–$F_0$ through $S_3$–$F_3$, and for generating a respective measurement signal supplied to a respective one of signal channels $V_0$–$V_7$, as will be described in greater detail in the context of FIG. 2. Feedback generating circuits 200 conveniently enhance the interface capability of the DAS by allowing the DAS to directly collect data from sensors, such as zero-flux current sensors, without having to use any external interface circuitry. As shown in FIG. 1, control unit 170 can readily include a programmable clock module 172 for supplying a programmable-frequency switching signal that enhances the operational capability of each feedback generating circuit.

Each respective decimation filter output signal becomes accessible to an external microprocessor, such as microprocessor 500, through a microprocessor interface 180. Assuming that, for example, a triangular "window" decimation filter embodiment is employed, upon completion of a triangular "window" accumulation, a suitable computation reset signal is employed for resetting computation of the next triangular "window". For example, availability of each triangular "window" accumulation can be determined based on the state of a data ready signal (DRDYZ) supplied by the control unit to the microprocessor via the microprocessor interface. It will be appreciated that suitable read signals can be provided by microprocessor 500 to read out a respective filtered or quantized output signal from the decimation filters once the data ready signal indicates that such filtered data is available. As will be appreciated by those skilled in the art, in general, each respective output signal of decimation filters 130 can include up to 2N bits of data. Thus, in the case of N=12, each respective output signal for the decimation filters can include up to 24 bits of data. However, depending on the particular decimation ratio being selected, useful data may not be available in all 24 bits. Typically, only eight bits of data are read at a time over the microprocessor interface, and thus multiple reads may be necessary to provide full data resolution for cases that contain useful data bits beyond the first eight bits of data for a given decimation filter output signal. Depending upon the specific application, the format for the output data can be selected as unsigned magnitude format or two's complement format. It will be appreciated that the data transferred to microprocessor 500 over the microprocessor interface is not limited to output data from the decimation filters being that additional operational modes can be provided which can readily generate additional data which can be readily transferred to microprocessor 500 over the microprocessor interface. For example, such additional data may include digital observations or measurements of the programmable-frequency switching signal supplied by programmable clock module 172; digital measurements for the PFOUT output signal supplied by power fail detector 136; and digital measurements obtained directly at the output of each delta-sigma modulator 120. Each of the above measurements advantageously allows for enhanced operational capability and more flexible testing for a DAS in accordance with the present invention. Further, suitable write signals can be provided by microprocessor 500 over the microprocessor interface to, for example, write a microprocessor-derived control word into the control unit via the microprocessor interface. This conveniently enables the control unit for controlling operation of the converter system, the individual test circuits and the operation of the feedback generating circuits. The various operational states for the DAS, such as those determined by the control data word written into the control unit, can be conveniently reset to predetermined default states based on the logic value of a reset signal labeled RESETZ. Microprocessor interface 180 can include a protocol interface selector 182 that, depending on the logic value of a MODE select signal applied from microprocessor 500, allows for advantageously interfacing with more than one family of microprocessors without having to use any external circuits. For example, when the MODE select signal has a logic value of ZERO, then protocol interface selector 182 allows for interfacing with microprocessors having a protocol such as the protocol for a TMS320C2x microprocessor (commercially available from Texas Instruments (TI) Inc., Dallas, Tex.); whereas when the MODE select signal has a logic value of ONE, then protocol interface selector 182 allows for interfacing with microprocessors having a protocol such as the protocol for a TMS320C1x microprocessor (also commercially available from TI). As will be appreciated by those skilled in the art, since the above-identified protocols jointly encompass a broad range of microprocessors, a DAS in accordance with the present invention conveniently provides interface capability with a broad range of microprocessors without having to use any additional external circuitry.

FIG. 2 shows a schematic for one of the feedback generating circuits 200 connected to a sensor, such as a zero-flux current sensor 100 which comprises a primary winding 16, a secondary winding 18 and a feedback winding 20, each respectively wound on a common core (not shown). Although feedback generating 200 is described as providing compensation to a zero flux current sensor, it will be appreciated that feedback generating circuit 200 could be employed for interfacing with sensors other than a zero-flux current sensor, such as a Hall-effect current sensor and other sensors which may require suitable compensation using a compensation signal derived through the use of feedback compensation techniques. Feedback generating circuit 200 advantageously generates a substantially continuous feedback signal, i.e., a signal which is not subject to any undesirable polarity reversal and which consequently avoids the need of any additional synchronization or signal polarity "bookkeeping" of the desired measurement signal.

A switching assembly includes first and second input switches made up of a pair of single-pole, double throw (SPDT) switches $204_1$ and $204_2$, which respectively couple the dotted end of secondary winding 18 to pass any AC signal therein to the first and second differential input ports of an operational amplifier 210 through a first connect pin $S_x$ (wherein subscript X corresponds to any of numbers 0–3 for a DAS having four separate feedback generating circuits, as shown in FIG. 1). The pair of switches in practice are implemented with semiconductor switching devices responsive to the programmable-frequency switching signal from programmable clock module 172 (FIG. 1) but, for simplicity of illustration, are shown as mechanical switches. FIG. 2A corresponds to a first switching period while FIG. 2B corresponds to a second switching period, as described in U.S. Pat. No. 5,568,047, entitled "A Current Sensor and Method Using Differentially Generated Feedback", assigned to the same assignee of the present invention and herein incorporated by reference. Operational amplifier 210 preferably comprises a fully differential operational amplifier, that is, an operational amplifier wherein each AC signal supplied at the two respective output ports is substantially 180° out-of-phase with respect to one another, when a differential input signal is applied at the two respective input ports of the operational amplifier. As shown in FIGS. 2A and 2B, during a given switching period, while a respective one of the two input ports is coupled to the dotted end of secondary winding 18, the other input port is connected to a predetermined electrical ground. The switching assembly further includes an output switch 206 (such as any of the SPDT switches described above) which periodically couples the first and second differential output ports of operational amplifier 210 to the dotted end of feedback winding 20 to pass the feedback signal therein through a second connect pin $F_x$ (wherein subscript X corresponds to any of numbers 0–3 for a DAS having four separate feedback generating circuits, as shown in FIG. 1). A third connect pin $V_y$ (wherein subscript Y corresponds to any of numbers 0–7 for a DAS having eight separate signal channels, as shown in FIG. 1) is conveniently connected to pass the measurement signal through a suitable scaling resistor 12, and, as previously suggested, to A/D converter system 110 (FIG. 1). Thus, in the exemplary embodiment described herein, even assuming that each feedback generating circuit is coupled to a respective zero-flux current sensor, the DAS would still provide interface capability for other four sensors that do not require use of any compensation signal being that the total number of signal input channels is eight for this exemplary embodiment.

It will be apparent to one skilled in the art that any DC offset voltage component in operational amplifier 210 is converted to a corresponding AC signal by the respective switching configurations of FIGS. 2A and 2B. The AC signal derived from the DC offset voltage is coupled through the common core (not shown) back to operational amplifier 210 in a manner which produces a compensating signal to maintain the effect of DC offset substantially close to zero and thus prevent operational amplifier 210 from being driven into saturation. As indicated by the respective arrow direction in FIGS. 2A and 2B, it will be further apparent that regardless of the switching period, the flow of current through feedback winding is unidirectional. In accordance with one advantage of the present feedback generating circuit, this unidirectional current flow, conveniently eliminates discontinuous polarity reversal in the desired measurement signal and this avoids the need for additional synchronization or signal polarity "bookkeeping". It can be shown that depending upon the specific operational characteristics, such as the frequency response characteristics, of the sensor coupled to the feedback generating circuit, it may be desirable that the switching assembly be switched at a selectable rate in response to a programmable-frequency switching signal which actuates the switching assembly. In essence, this frequency selection capability allows for efficiently and economically matching or adapting the feedback generating circuit to the specific characteristics of the specific sensor being used in any given application. As used herein the expression "programmable-frequency" switching signal refers to a signal whose frequency can be programmed or selected by the user to have a respective value chosen from a predetermined set of two or more frequency values.

Figure 3:
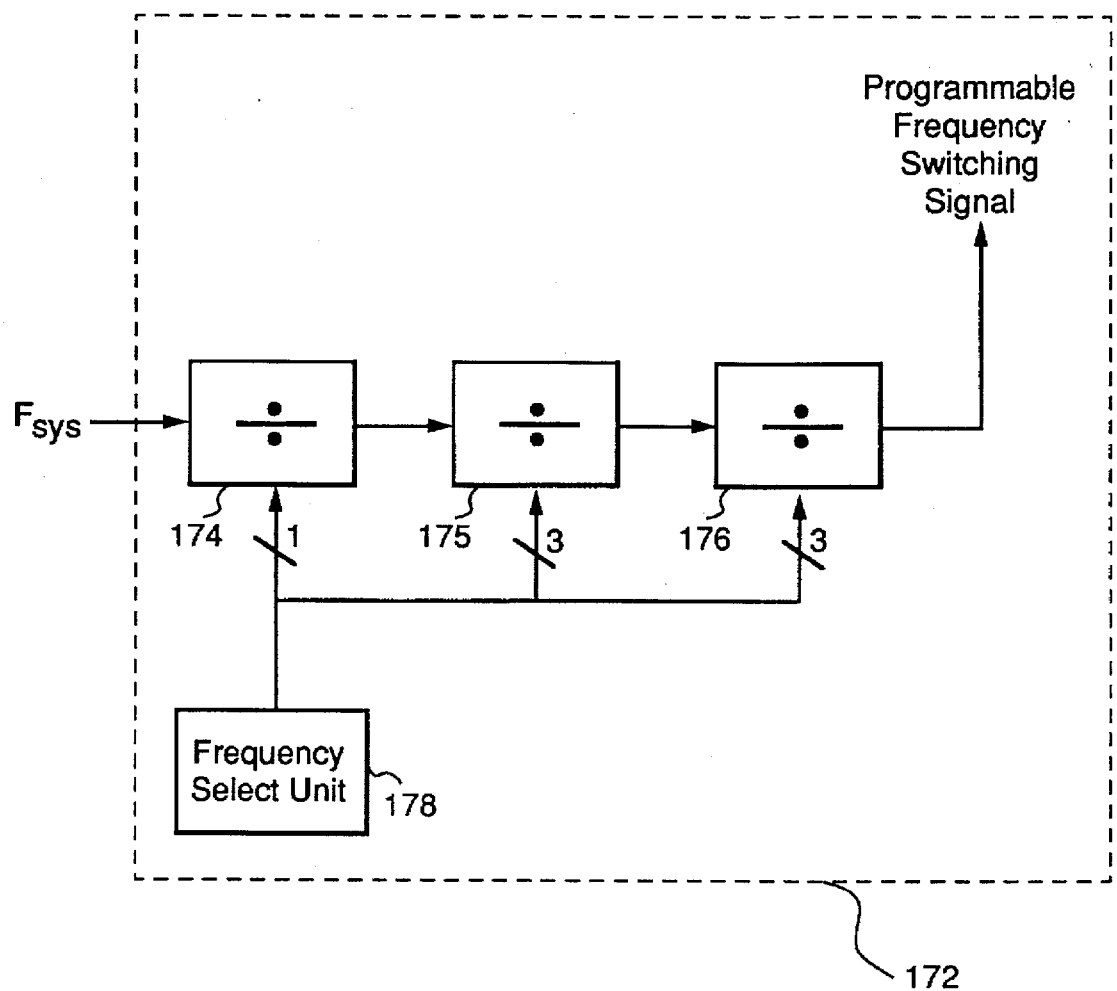
FIG. 3 shows a block diagram for a programmable clock module that can be used for actuating the switching assembly of FIGS. 2A and 2B.

FIG. 3 shows a simplified block diagram for a programmable clock module 172 that can be incorporated in the control unit 170 (FIG. 1) for generating the programmable-frequency switching signal that allows the switching assembly to be switched at a selectable rate. Module 172 comprises three counters 174–176 which respond to respective frequency control signals from a frequency select unit 178 so as to provide different scales factors to the system clock signal. For example, counter 174 can readily provide two different scale factors depending on the state for the single control frequency signal from frequency control unit 178. On the other hand, counters 175 and 176 could each respectively provide up to eight separate scale factors in response to the eight different states that can be provided by the three separate frequency select signals respectively applied to counters 175 and 176. The range of frequency selection can be conveniently increased by choosing either one of counter 175 and 176 to provide respective scale factors which are not a power of two scale factors. For example, in lieu of providing power of two scale factors, either one of counters 175 and 176 could provide prime scale factors, i.e., scale factors that correspond to predetermined prime numbers.

Figure 4:
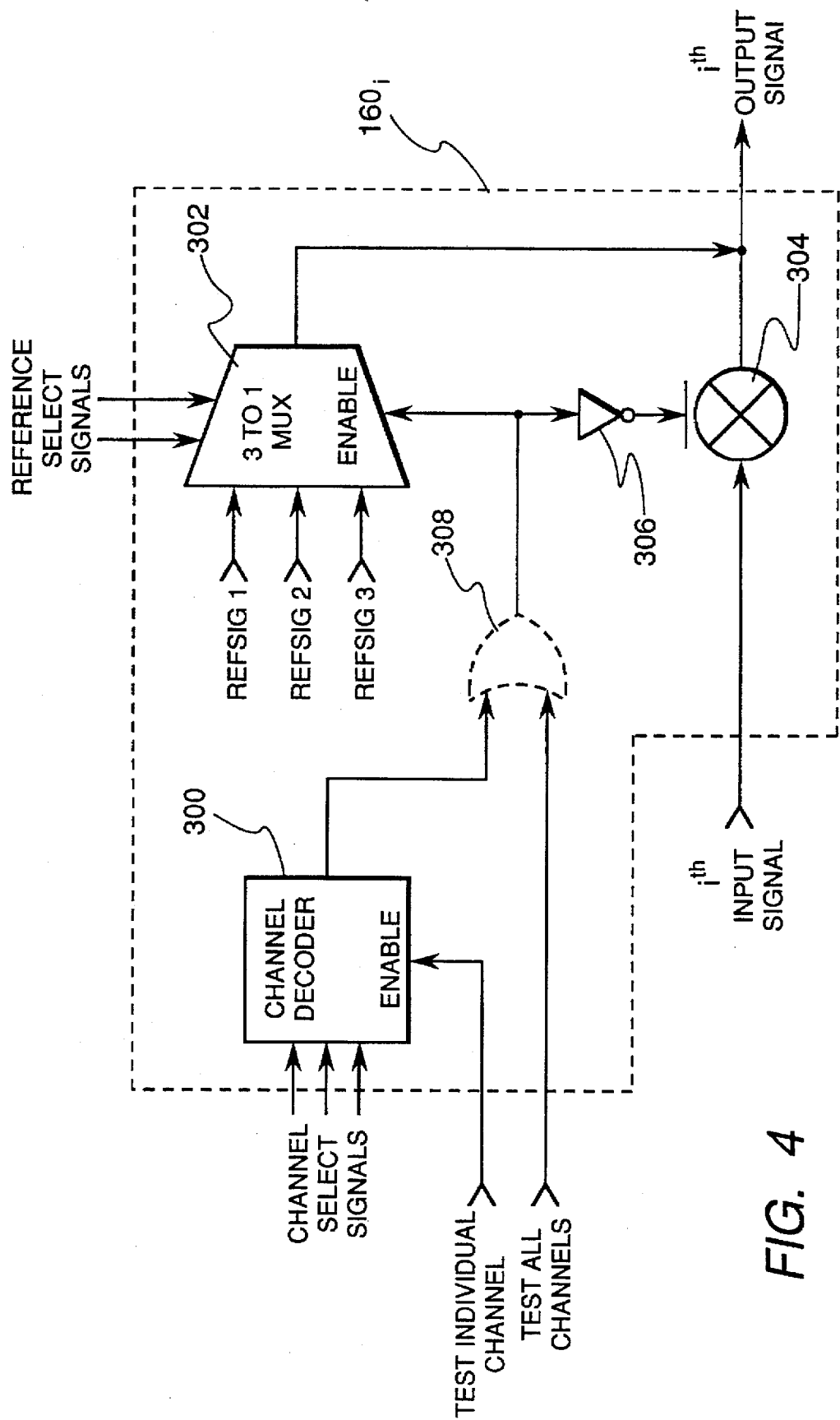
FIG. 4 shows additional details for any given one of the individual test circuits shown in FIG. 1.

FIG. 4 is a block diagram for any given one of the individual test circuits $160_0$–$160_7$ shown in FIG. 1. As shown in FIG. 1, any individual test circuit $160_i$ has a channel decoder 300 responsive to predetermined channel select signals for producing a respective channel decoder output signal. Channel decoder 300 conveniently enables the user to select which particular signal channel is to undergo testing. For example in FIG. 4, channel decoder 300 is shown as receiving three separate channel select signals. This example assumes that DAS 10 (FIG. 1) has at most eight separate signal channels being that in general the minimum number of channel select signals required is given by $\log_2(m)$, where m is the total number of channels in the DAS. In this example, the three channel select signals would allow for selecting any given one of the eight signal channels depending on the respective states for such channel select signals. A multiplexer 302 is responsive to predetermined reference select signals and to the decoder output signal for supplying during the test mode of operation a selected one of the predetermined reference signals to the respective signal channel being coupled to the individual test circuit therein. The decoder output signal is supplied to the enable port of multiplexer 302 so that, depending on the state of the decoder output signal, multiplexer 302 supplies one of the selected reference signals during the test mode of operation. Conversely, during normal operation, the state of the decoder output signal would be chosen so that none of the predetermined reference signals is supplied by multiplexer 302 so as to not interfere with the normal operation of the DAS. By way of example, multiplexer 302 is shown as receiving three different reference signals identified as $REFSIG_{1-2}$, and thus multiplexer 302 is conveniently chosen as a three-to-one multiplexer. In this example, the number of reference select signals is two being that this allows for selecting any given one of the three reference signals depending on the respective states for such reference select signals. It will be appreciated that the present invention need not be limited to a three-to-one multiplexer being that, if desired, additional reference signals can be readily supplied to multiplexer 302. A switching gate 304 is responsive to the channel decoder output signal, either directly, or through an optional OR gate 308 (represented by a dashed line), so that during the normal mode of operation the switching gate is in a respective conductive state for allowing the respective input signal for the signal channel coupled to the test circuit therein to pass therethrough. In this example, test circuit $160i$ would be coupled to the ith channel and thus during the normal mode of operation the switching gate in test circuit $160i$ would allow the respective input signal for the ith channel to pass therethrough. Conversely, during the test mode of operation, switching gate 304 in test circuit $160_i$ could be in a respective nonconductive state for interrupting the respective input signal for the ith channel from passing therethrough. Switching logic means, such as optional OR gate 308, can be conveniently employed for simultaneously selecting each of the plurality of signal channels to be in the test mode of operation, if so desired. For example, by properly selecting the state of the signal identified as "TEST ALL CHANNELS" the user would be able for simultaneously causing switching gate 304 in each test circuit to be in the nonconducting state while enabling multiplexer 302 in each test circuit to supply any selected reference signal. A signal inverter 306 can be employed for providing suitable signal inversion to the output signal from OR gate 308. In operation, a DAS in accordance with the present invention allows for efficiently providing at a relatively low cost substantial functionality even when any one of the selected channels is undergoing testing.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A programmable data acquisition system comprising:
   a plurality of input signal channels for receiving a respective input signal during a normal mode of operation;
   circuit means for selecting respective ones of said plurality of channels to receive predetermined reference signals during a test mode of operation while uninterruptedly providing the normal mode of operation in any remaining unselected channels in said data acquisition system;
   analog-to-digital converter means for supplying quantized electrical signals at a predetermined rate, said converter means being responsive to any signals carried in said plurality of signal channels as selected by said circuit means;
   a control unit for supplying respective control signals to the circuit means and to the converter means; and
   a microprocessor interface coupling said control unit to an external microprocessor, said microprocessor interface providing a microprocessor-derived control word from said microprocessor to said control unit, said microprocessor interface further transferring the quantized electrical signals supplied by said analog-to-digital converter means to said microprocessor, said microprocessor interface further having a protocol interface selector for adapting said microprocessor interface to any one of a variety of said external mircroprocessors.

2. The data acquisition system of claim 1 wherein said converter means comprises a plurality of sigma-delta modulators and a corresponding plurality of decimation filters having a selectable decimation ratio, each respective one of said decimation filters being coupled to receive an output signal from a respective one of said sigma-delta modulators.

3. The data acquisition system of claim 2 further comprising at least one feedback generating circuit for generating a measurement signal supplied to a respective one of said signal channels.

4. The data acquisition system of claim 3 wherein said feedback generating circuit comprises:

an operational amplifier; and a switching assembly for generating a compensating AC signal from a DC offset voltage across the input ports of said operational amplifier, said switching assembly being switched at a selectable rate in response to a switching signal.

5. The data acquisition system of claim 4 wherein said operational amplifier includes first and second differential input ports and first and second differential output ports.

6. The data acquisition system of claim 4 wherein said control unit includes a programmable clock module for generating the switching signal applied to said switching assembly.

7. The data acquisition system of claim 6 wherein said microprocessor interface transfers respective digital measurements of the switching signal generated by said programmable clock module and the output signal from said power-fail detector.

8. The data acquisition system of claim 1 further comprising a power-fail detector for generating an output signal indicative of a predetermined power-fail condition in said data acquisition system.

9. A programmable data acquisition system incorporated in a single monolithic integrated circuit chip, said data acquisition system comprising:

a plurality of input signal channels for receiving a respective input signal during a normal mode of operation;

a plurality of individual test circuits for selecting respective ones of said plurality of input signal channels to receive predetermined reference signals during a test mode of operation while uninterruptedly providing the normal mode of operation in any remaining unselected channels in said data acquisition system;

an analog-to-digital converter system for supplying quantized electrical signals at a predetermined rate, said converter system being responsive to any signals carried in said plurality of input signal channels as selected by said individual test circuits;

at least one feedback generating circuit for generating a measurement signal supplied to a respective one of said input signal channels, said feedback generating circuit comprising:

an operational amplifier having a first and a second differential input port and having a first and a second differential output port; and a switching assembly for generating a compensating AC signal from a DC offset voltage across said first and said second differential input port of said operational amplifier, said switching assembly being switched at a selectable rate in response to a switching signal; and a control unit for supplying respective control signals to the individual test circuits and to the converter system, said control unit including a programmable clock module for generating the switching signal applied to said switching assembly.

10. The data acquisition system of claim 9 wherein said converter system comprises a plurality of sigma-delta modulators and a corresponding plurality of decimation filters having a selectable decimation ratio, each respective one of said decimation filters being coupled to receive an output signal from a respective one of said sigma-delta modulators.

11. The data acquisition system of claim 10 further comprising a microprocessor interface coupling said control unit to an external microprocessor, said microprocessor interface providing a microprocessor-derived control word from said microprocessor to said control unit, said microprocessor interface further transferring the quantized electrical signals supplied by the converter means to said microprocessor.

12. The data acquisition system of claim 11 wherein said microprocessor interface further comprises a protocol interface selector.

13. The data acquisition system of claim 12 further comprising a power-fail detector for generating an output signal indicative of a predetermined power-fail condition in said data acquisition system.

14. The data acquisition system of claim 13 wherein said microprocessor interface transfers respective digital measurements of the switching signal generated by said programmable clock module and the output signal from said power-fail detector.

* * * * *